(12) United States Patent
Kawasaki

(10) Patent No.: US 9,472,497 B2
(45) Date of Patent: Oct. 18, 2016

(54) SEMICONDUCTOR DEVICE

(71) Applicant: Sumitomo Electric Industries, Ltd., Osaka-shi (JP)

(72) Inventor: Takeshi Kawasaki, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 1 day.

(21) Appl. No.: 14/724,598

(22) Filed: May 28, 2015

(65) Prior Publication Data

US 2015/0349070 A1 Dec. 3, 2015

(30) Foreign Application Priority Data

May 30, 2014 (JP) .................................. 2014-112006

(51) Int. Cl.

| | | |
|---|---|---|
| H01L 23/48 | (2006.01) | |
| H01L 23/50 | (2006.01) | |
| H01L 29/78 | (2006.01) | |
| H01L 29/812 | (2006.01) | |
| H01L 23/482 | (2006.01) | |
| H01L 29/417 | (2006.01) | |
| H01L 29/778 | (2006.01) | |

(52) U.S. Cl.
CPC ............ *H01L 23/50* (2013.01); *H01L 23/482* (2013.01); *H01L 29/7827* (2013.01); *H01L 29/812* (2013.01); *H01L 29/41758* (2013.01); *H01L 29/778* (2013.01); *H01L 2224/11* (2013.01)

(58) Field of Classification Search
CPC ............ H01L 23/482; H01L 29/7827; H01L 29/778; H01L 29/41758
See application file for complete search history.

(56) References Cited

U.S. PATENT DOCUMENTS

| 6,028,348 | A | 2/2000 | Hill | |
|---|---|---|---|---|
| 2005/0161732 | A1* | 7/2005 | Mizukami | H01L 29/0623 257/327 |
| 2010/0213516 | A1* | 8/2010 | Ohmi | H01L 21/02381 257/255 |
| 2012/0037969 | A1* | 2/2012 | Sanders | H01L 23/481 257/296 |

FOREIGN PATENT DOCUMENTS

| JP | 08-008272 A | 1/1996 |
|---|---|---|
| JP | 2012-084723 A | 4/2012 |

* cited by examiner

*Primary Examiner* — Nicholas Tobergte
(74) *Attorney, Agent, or Firm* — Venable LLP; Michael A. Sartori

(57) ABSTRACT

A semiconductor device is disclosed. The semiconductor comprises a field effect transistor (FET) provided in a substrate, the FET including a plurality of gates, sources, and drains each extending in parallel along a longitudinal direction of the gates, the sources, and the drains; an upper electrode provided above the substrate with an insulating layer therebetween, the upper electrode having an opening where the FET is disposed, and a plurality of source extractions each connected to respective sources through via structures passing the insulating layer and to the upper electrode, the source extractions extending along the longitudinal direction.

17 Claims, 9 Drawing Sheets

SEMICONDUCTOR DEVICE

BACKGROUND OF THE INVENTION

1. Field of the Invention

The present invention relates to a semiconductor device.

2. Background Arts

U.S. Pat. No. 6,028,348B discloses an integrated circuit in which thermal resistance is reduced. The integrated circuit includes a transistor formed on an upper surface of a substrate, a ground surface provided on the transistor, a bonding pad provided on a back surface of the substrate, and a conductive via hole passing through the substrate to connect to the bonding pad.

In a field of wireless communication, a power amplifier capable of transmitting signals by large output is arranged in a final stage of a transmitter. Output of the transmitter depends on power and efficiency of the power amplifier. In order to improve the efficiency of the power amplifier, gallium arsenide (GaAs) or gallium nitride (GaN) having a high figure of merit is used as a material of a circuit element in high frequency bands, such as a microwave band or a millimeter-wave band. Simultaneously, in order to increase output of the power amplifier, a gate width of a field effect transistor (FET) is increased to increase an operating current, and a withstand voltage of the element is improved to raise an operating voltage.

As a structure of a device including the element formed on an insulated substrate, such as a GaAs FET and a GaN FET, an element structure in which a pattern that gives a reference potential is provided on a substrate back surface and a source of the FET is connected to the reference potential by a via hole passing through the substrate between the substrate back surface and the FET, is known. However, in the case of manufacturing the FET having a large gate width by a structure like this, the following problem arises.

For example, in the case of manufacturing an amplifier by a grounded source configuration, the via hole that connects the source of the FET and a back surface electrode and passes through the substrate has a significant length. In the microwave band and the millimeter-wave band, a conductor having a significant length behaves as an inductance. Thus, an interconnection exerts great influence on a reflection characteristic and an amplification characteristic of the amplifier. On the other hand, the inductance is optimized by adjusting a length and a width of the interconnection, thereby stabilizing a circuit and obtaining an excellent characteristic can be realized.

However, in the case that the number of fingers of a gate is increased in order to secure a large gate width, the plurality of sources are also needed. A length of an interconnection between the source and the back surface electrode, that is, a length to the via hole related to each source, is different for each source. Thus, the inductance that the interconnection between each source and the via hole has is also different for each source. In this case, since it is difficult to optimize the distance between the source and the via hole, the high frequency characteristic of the amplifier is degraded.

In order to prevent the high frequency characteristic from degrading, there is a method of fixing the length of the interconnection between each source and the via hole by arraying a plurality of unit FETs having one or two sources in parallel and arranging the via hole between the adjacent FETs. However, this method requires many via holes to be provided for the number of the sources. Thus, a size of the element becomes large. Further, since a length of an extraction connected to each gate and each drain is different for each unit FET, a phase difference is generated in output signals of each unit FET. When the plurality of output signals having the phase difference are subjected to vector composition, an amplitude of the output signals becomes smaller than a value for which the output signal from one FET is multiplied by the number of the unit FETs, and output as large as expected from the number of the unit FETs is not attained.

As another circuit structure, a circuit structure called an inverted micro strip line (MSL) is known. The inverted MSL is a structure in which an interconnection of a top layer is a reference potential layer, and is generally used in a surface mounting device. In the inverted MSL structure, the reference potential layer is arranged not on a back surface side of a substrate but on a surface side. Thus, a source of an FET arranged on the surface side of the substrate and a reference potential can be connected without using a substrate via hole of a large size. Further, by providing a via hole immediately above a source region, an inductance equivalently connected to the source region can be made zero.

However, in the case of providing a via structure immediately above the source region, since a distance between the source region and the via structure is almost zero, the inductance connected to the source region cannot be optimized to stabilize a circuit. In order to optimize the inductance, it is needed to adjust the distance between the source region and the via structure. As a result, similarly to a device provided with a reference potential pattern on a substrate back surface, in the case of increasing the number of fingers, the distance between the via structure and the source region cannot be optimized. Also, the problem that a phase difference is generated in the output signals among the plurality of FETs and large output cannot be attained in the case of increasing the number of fingers of the FET arises similarly to the case of a circuit configuration of providing the reference potential pattern on the substrate back surface.

SUMMARY OF THE INVENTION

One aspect of the present application relates to a semiconductor device. The semiconductor device comprising a field effect transistor (FET) provided in a substrate, the FET including a plurality of gates, sources, and drains each extending in parallel along a longitudinal direction of the gates, the sources, and the drains; an upper electrode provided above the substrate with an insulating layer therebetween, the upper electrode having an opening where the FET is disposed; and a plurality of source extractions each connected to respective sources through via structures passing the insulating layer and to the upper electrode, the source extractions extending along the longitudinal direction.

Another aspect of the present application relates to a semiconductor device. The semiconductor devices comprising a field effect transistor (FET) provided in a substrate, the FET including at least two gates, two sources, and a drain each extending in parallel along a longitudinal direction of the two gates, the two sources, and the drain, one of the gates being put between one of the sources and the drain, another of the gates being put between another of the sources and the drain; an upper electrode provided above the substrate with an insulating layer therebetween, the upper electrode having an opening where the FET is disposed; and at least two source extractions each connected to respective sources through via structures passing the insulating layer and to the upper electrode, one of the source extractions extending along the longitudinal direction and another of the source extractions extending along a direction perpendicular to the longitudinal direction, wherein the at least two source extractions have respective length from the via structures to the upper electrode same with the other.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Specific examples of a semiconductor device according to an embodiment of the present invention will be described with reference to the drawings hereinafter. The present invention is not limited to the examples but shown in the claims, and is intended to include all modifications within the scope and meaning equivalent to the scope of the claims.

Figure 1:
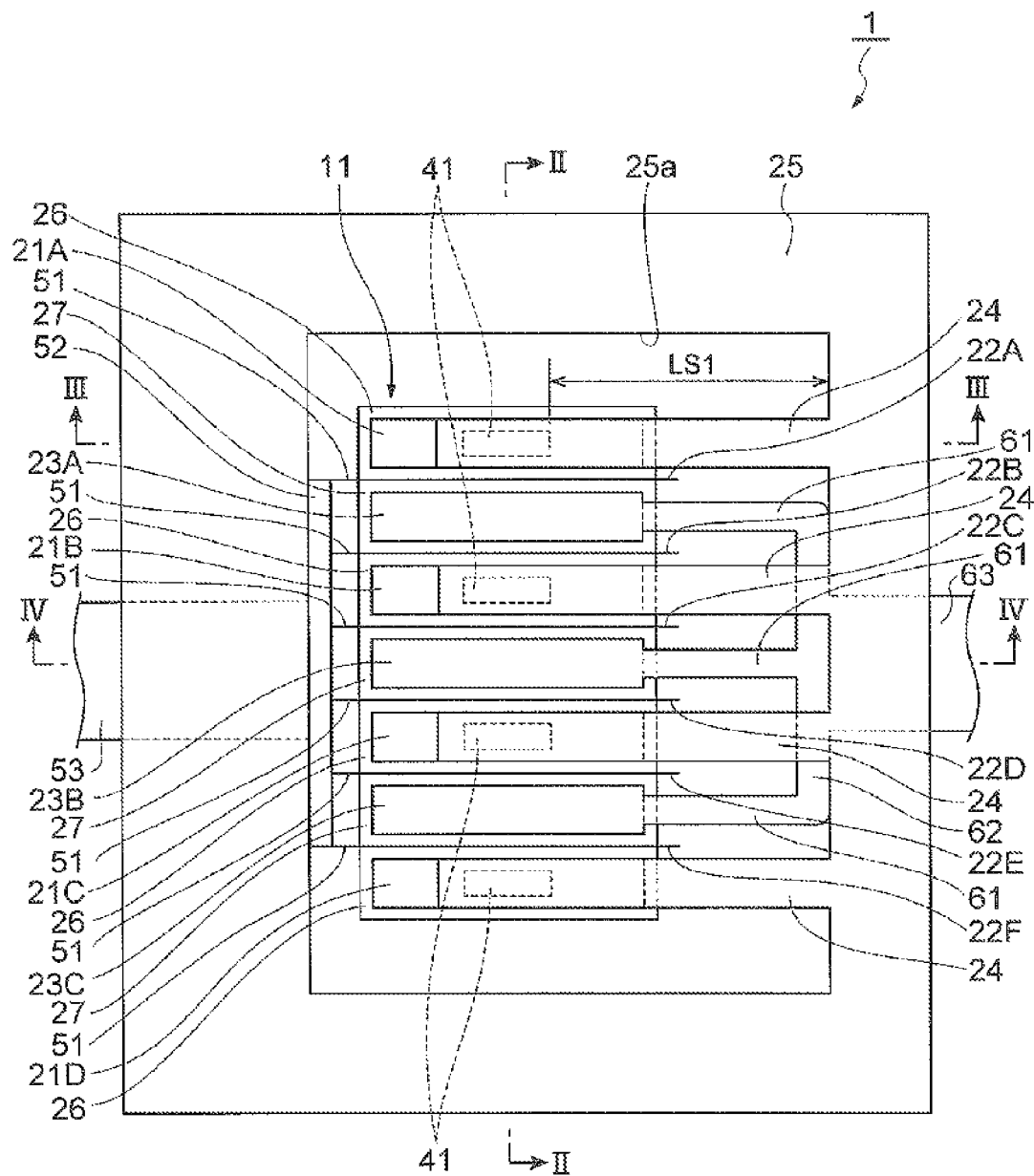
FIG. 1 is a plan view of a semiconductor device according to one embodiment.
Figure 2:
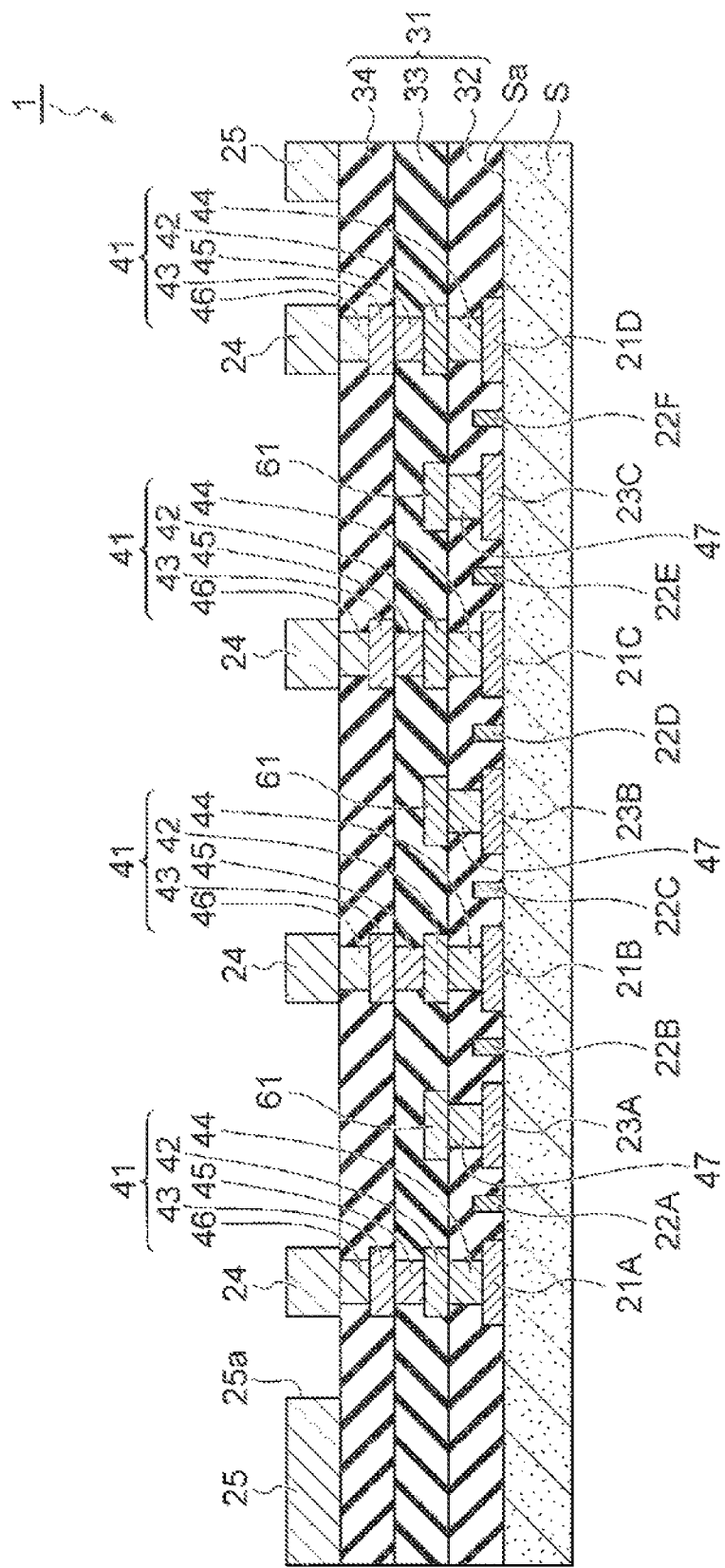
FIG. 2 is a cross-sectional view taken along a line II-II in FIG. 1.
Figure 3:
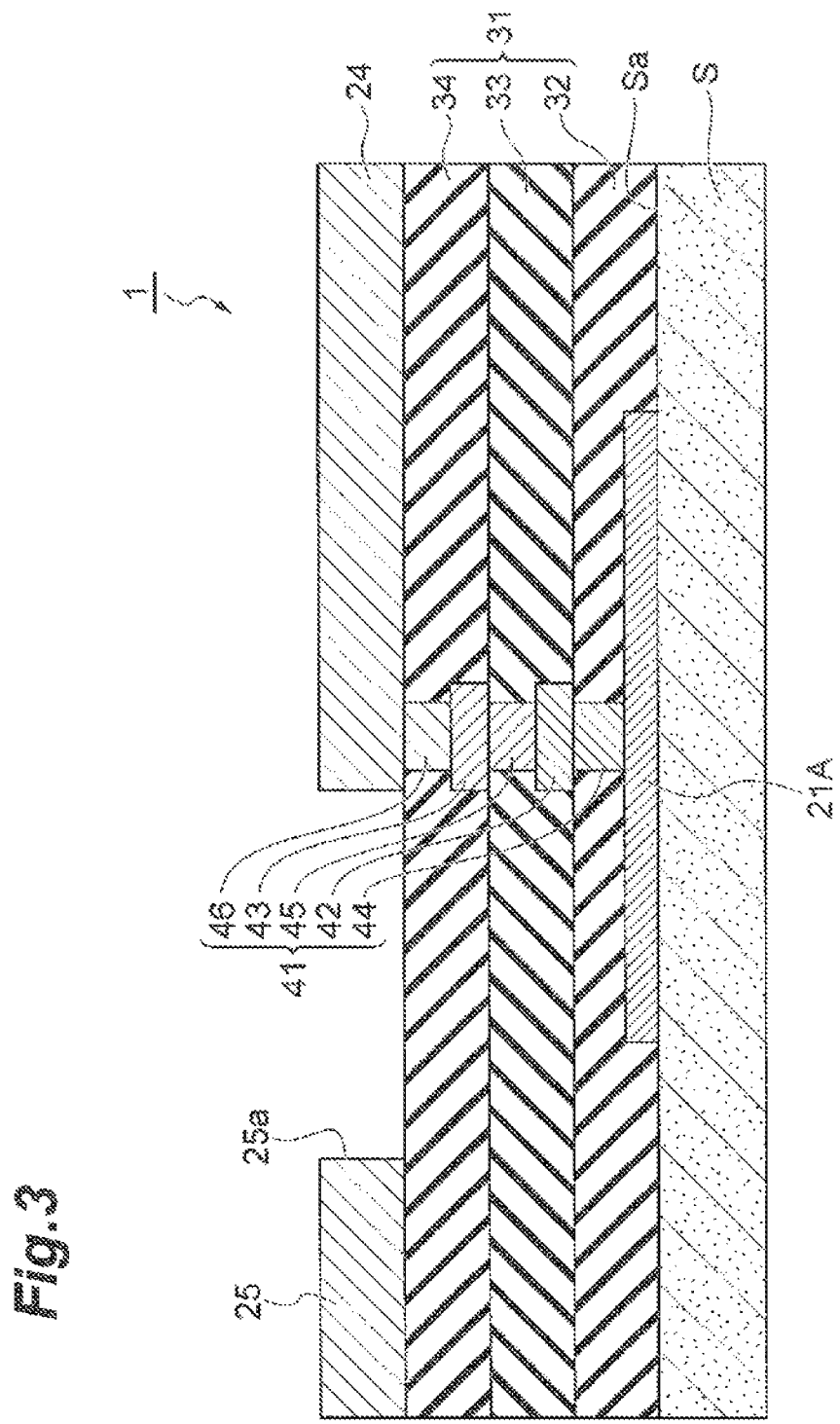
FIG. 3 is a cross-sectional view taken along a line III-III in FIG. 1.
Figure 4:
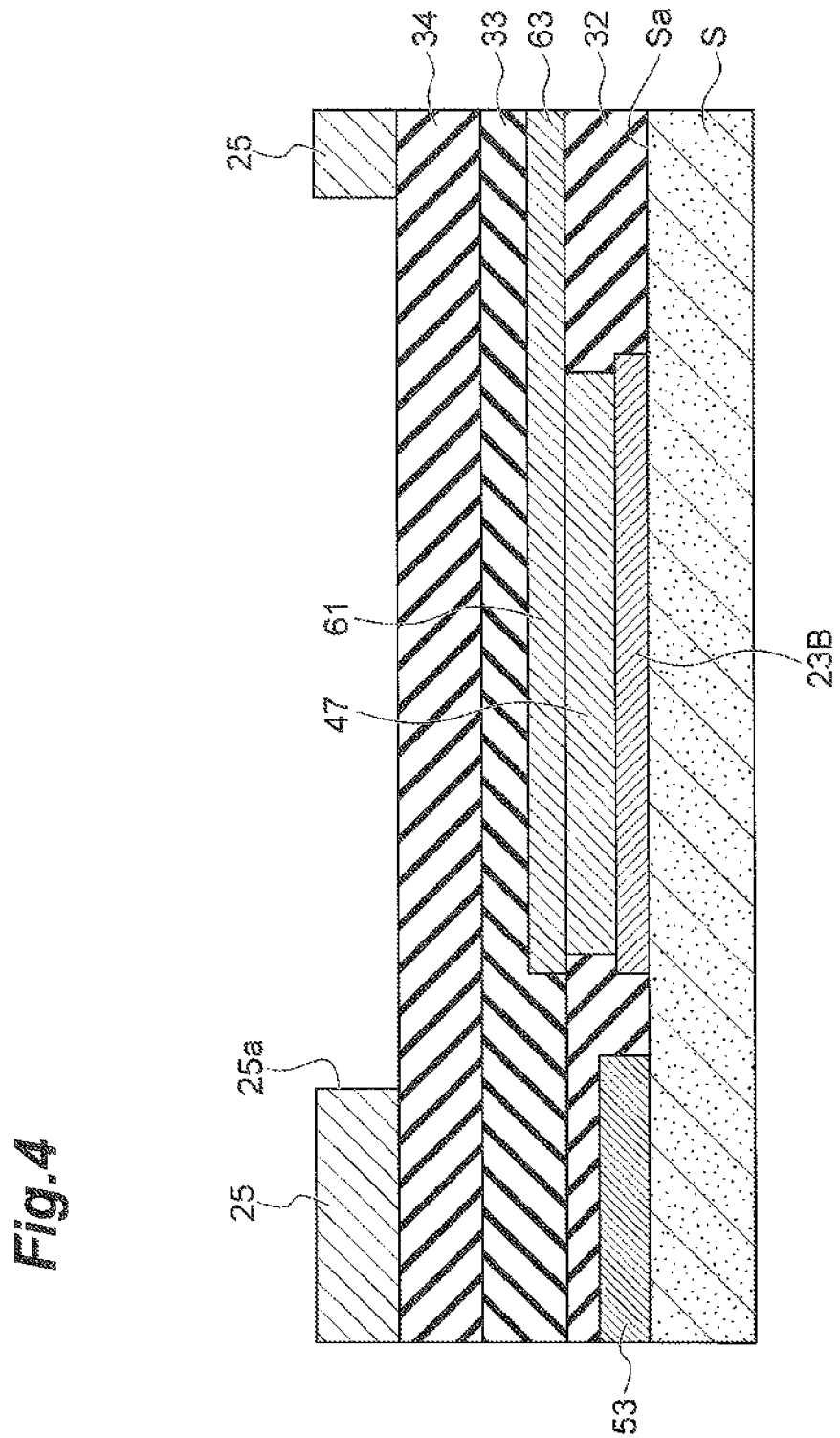
FIG. 4 is a cross-sectional view taken along a line IV-IV in FIG. 1.

FIG. 1 is a plan view of a semiconductor device according to one embodiment. FIG. 2 is a cross-sectional view taken along a line II-II denoted in FIG. 1. FIG. 3 is a cross-sectional view taken along a line III-III denoted in FIG. 1. FIG. 4 is a cross-sectional view taken along a line IV-IV denoted in FIG. 1.

A semiconductor device 1 includes a field effect transistor (FET) 11. The semiconductor device 1 is, for example, incorporated in a radio transmitter or the like to be connected to another circuit element, and configures a power amplifier.

The FET 11 is arranged on a primary surface Sa of a substrate S. The FET 11 includes four sources 21A-21D, six gates 22A-22F, and three drains 23A-23C. The sources 21A-21D and the drains 23A-23C are in non-rectifying contact with a semiconductor layer. The gates 22A-22F are in Schottky contact with the semiconductor layer. The gates 22A-22F may be a structure that a gate insulator is interposed between the gates 22A-22F and the semiconductor layer, other than a type of being in Schottky contact. For the semiconductor layer, in addition to a silicon (Si) based semiconductor, a GaAs or GaN based semiconductor (e.g. GaN) or SiC or the like can be adopted. As a structure of the FET, in addition to a type that an entire bulk semiconductor layer or epitaxially grown semiconductor layer is a channel, a high electron mobility transistor (HEMT) for which a two-dimensional electron gas formed by laminating two semiconductors of different energy gaps is a channel can be also adopted.

The sources 21A-21D and the drains 23A-23C are alternately arrayed in the FET 11. One each of the gates 22A-22F is arranged between the adjacent sources 21A-21D and drains 23A-23C. In this way, the FET 11 has six fingers. The sources 21A-21D, the gates 22A-22F, and the drains 23A-23C are all arranged with the longitudinal direction thereof being in parallel. In the following description, an array direction of the sources 21A-21D and the drains 23A-23C can be described as a disposing direction of electrodes, while an extending direction of the gates 22A-22F can be described as a longitudinal direction of the electrodes.

The sources 21A-21D are respectively arranged on each of source regions 26 and the drains 23A-23C are respectively arranged on each of drain regions 27. The source regions 26 and the drain regions 27 are formed on the primary surface Sa of the substrate S. The source regions 26 and the drain regions 27 are doped with impurities by high concentration. The sources 21A-21D and the source regions 26, and the drains 23A-23C and the drain regions 27 are electrically connected respectively through a contact layer not shown in the figure.

As illustrated in FIGS. 2-4, the semiconductor device 1 has a wiring structure of four layers including the gates on the primary surface Sa. Hereinafter, individual wiring layers are described as a first wiring layer to a fourth wiring layer in the order from the one closest to the substrate S. An insulating film 31 is formed on the primary surface Sa covering the FET 11. The insulating film 31 includes a first insulating layer 32, a second insulating layer 33, and a third insulating layer 34. The first insulating layer 32 electrically insulates the first wiring layer and the second wiring layer. The second insulating layer 33 electrically insulates the second wiring layer and the third wiring layer. The third insulating layer 34 electrically insulates the third wiring layer and the fourth wiring layer. The insulating film 31 is made of polyimide, for example.

The semiconductor device 1 further includes source extractions 24 and a ground pattern 25 in the fourth wiring layer. The ground pattern 25 is arranged on the insulating film 31. The ground pattern 25 does not overlap with the FET 11. Specifically, the ground pattern 25 has a roughly rectangular opening 25a, and the FET 11 is arranged inside the opening 25a.

The ground pattern 25 is connected to a reference potential outside the semiconductor device 1 and gives the reference potential of the semiconductor device 1. The source extractions 24 respectively connect the sources 21A-21D to the ground pattern 25. As illustrated in FIGS. 2-4, the source extractions 24 and the ground patterns 25 are formed in the fourth wiring layer. Thus, the source extractions 24 and the ground pattern 25 are arranged at positions higher than the FET 11. The source extractions 24 and the ground pattern 25 may be provided in the same wiring layer as in the present embodiment, or both may be provided in different wiring layers. In the case of providing them in the different wiring layers, both can be connected by a via hole.

As illustrated in FIG. 2 and FIG. 3, the semiconductor device 1 includes via structures 41 that connect the sources 21A-21D and the source extractions 24, respectively. The via structure 41 includes a first pad 42, a second pad 43, a first via metal 44, a second via metal 45, and a third via metal 46. The first pad 42 is formed in the second wiring layer, and the second pad 43 is formed in the third wiring layer. The first via metal 44 passes through the first insulating layer 32, and electrically connects the sources 21A-21D and the first pad 42. The second via metal 45 passes through the second insulating layer 33, and electrically connects the first pad 42 and the second pad 43. The third via metal 46 passes through the third insulating layer 34, and electrically connects the second pad 43 and the extraction 24. The first pad 42, the second pad 43, the first via metal 44, the second via metal 45, and the third via metal 46 are made of gold (Au), for example.

Here, as illustrated in FIG. 1, the individual source extractions 24 extend in the same longitudinal direction. Also, the individual source extractions 24 have the equal length. That is, as illustrated in FIG. 1, distances from the via structure 41 connected to the source extraction 24 to the ground pattern 25 connected to the source extraction 24 are $L_{s1}$ and are equal in all the source extractions 24.

As illustrated in FIG. 1, the semiconductor device 1 includes a gate bus bar 52 extending in the disposing direction of the electrodes of the FET 11. The gates 22A-22F are electrically connected to the gate bus bar 52 through a gate extraction 51 extending in a width direction of the FET 11. The gate bus bar 52 is connected to a gate interconnection 53. The gate interconnection 53 is connected to a circuit outside the semiconductor device 1. A width of the gate interconnection 53 is determined so as to have a predetermined characteristic impedance (e.g. 50Ω). The ground pattern 25 does not overlap with the gate bus bar 52. That is, the gate bus bar 52 is positioned inside the opening 25a of the ground pattern 25. The gate bus bar 52 and the gate interconnection 53 are arranged in the first wiring layer.

As illustrated in FIG. 1, the semiconductor device 1 includes a drain bus bar 62 extending in a length direction of the FET 11. The drains 23A-23C are electrically connected to the drain bus bar 62 through a drain extraction 61 extending in the longitudinal direction of the electrodes. The drain bus bar 62 is connected to a drain interconnection 63. A width of the drain interconnection 63 is determined so as to have a predetermined characteristic impedance (e.g. 50Ω). The ground pattern 25 does not overlap with the drain bus bar 62. That is, the drain bus bar 62 is positioned inside the opening 25a of the ground pattern 25.

As illustrated in FIG. 2 and FIG. 4, the drains 23A-23C are formed in the first wiring layer. The drain bus bar 62 is formed in the substrate S and the second wiring layer. Thus, the semiconductor device 1 includes via metals 47 for connecting the drains 23A-23C and the drain extraction 61. Each of the via metals 47 passes through the first insulating layer 32, and electrically connects each of the drains 23A-23C with each of the drain extractions 61.

Figure 5:
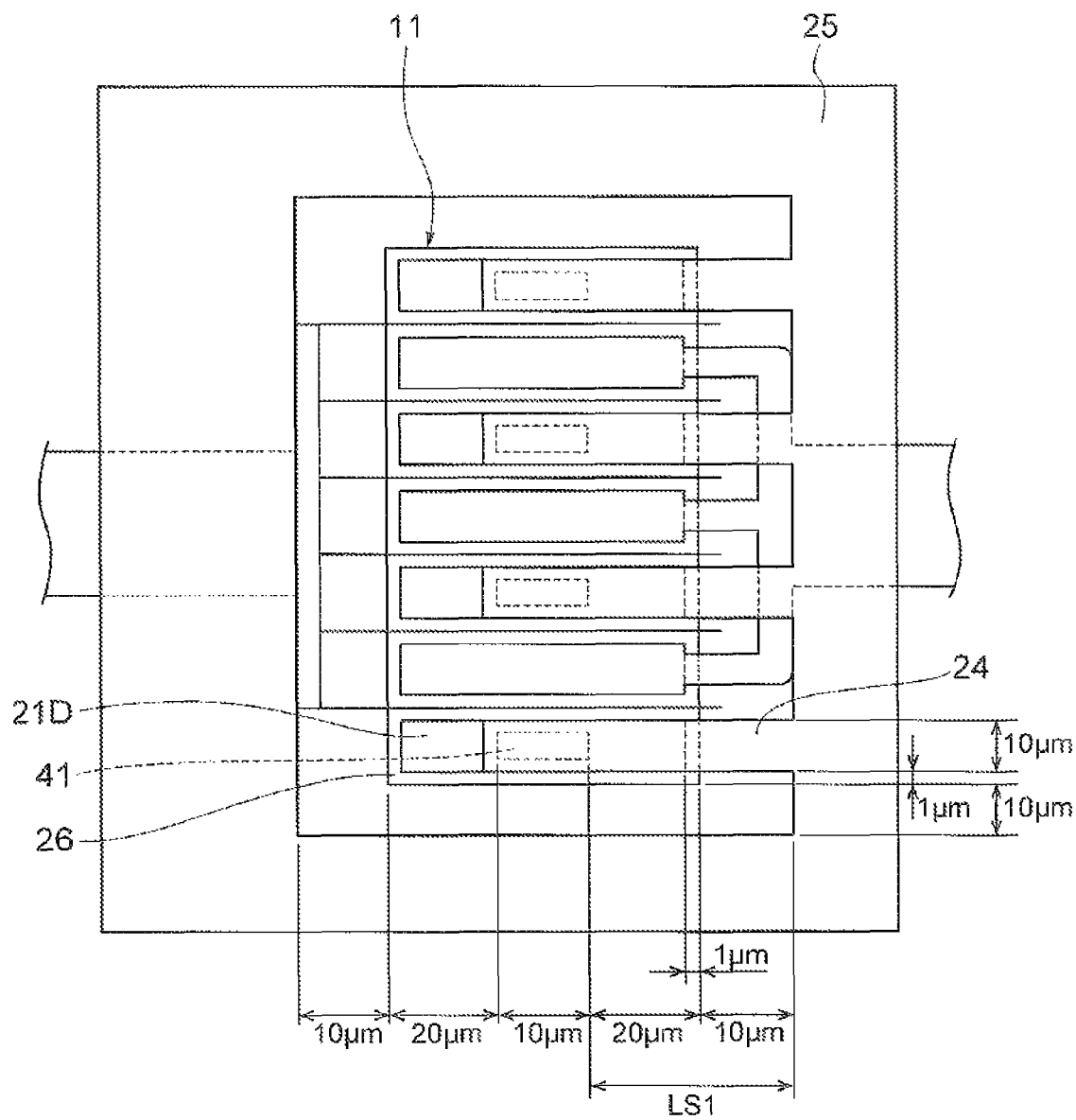
FIG. 5 is a plan view illustrating dimensions of individual parts of the semiconductor device according to one embodiment.

FIG. 5 illustrates one example of dimensions of individual parts of the semiconductor device 1. A length of the via structure 41 along the longitudinal direction of the electrodes is 10 μm for example. A distance between an outer edge of the via structure 41 and an outer edge of the source region 26 is 20 μm for example. A distance between the outer edge of the source region 26 and the drain region 27 and an inner edge of the ground pattern 25, that is, an edge of the opening 25a, is 10 μm for example. A width of the source extraction 24 along the disposing direction of the electrodes is 10 μm for example. Also, though omitted in the figure, a gate length (a width along the disposing direction of the electrodes) of the gates 22A-22F is 0.15 μm for example.

As described above, in the semiconductor device 1, the opening 25a of the ground pattern 25 is arranged in a region where the FET 11 is formed. Then, each of at least two sources 21A-21D is connected to the ground pattern 25 by the source extraction 24 extending in the longitudinal direction of the sources 21A-21D, the gates 22A-22F, and the drains 23A-23C. In the semiconductor device 1, the individual source extractions 24 have the equal length. Thus, since the inductances connected to the plurality of sources 21A-21D become equal, by adjusting the lengths of all the source extractions 24 equally, a characteristic of the element can be optimized more easily. Lengths inside the gate bus bar 52 connecting the gates 22A-22F and the gate interconnection 53 are respectively different each other, and lengths inside the drain bus bar 62 connecting the drains 23A-23C and the drain interconnection 63 are respectively different each other. However, by optimizing the length of the source extraction 24 for each of the sources 21A-21D, a value of a parasitic inductance consequently formed between the sources 21A-21D and the ground pattern 25 can be adjusted for each of the sources 21A-21D. Therefore, the characteristic of the FET 11 can be improved, thereby the output from the semiconductor device 1 can be maximized by arranging phases of signals outputted from the drains 23A-23C.

The individual source extractions 24 extend in the same direction as the drain extraction 61 connected to the drains 23A-23C in the semiconductor device 1. Since all the source extractions extend only in one direction, there is no need of providing regions for arranging the extractions in a plurality of directions, and an area of the semiconductor device 1 can be suppressed to be small. The source extractions 24 extending in the same direction are arranged on the same side as the drain extraction 61. It is because that capacitance generated between the drains 23A-23C and the sources 21A-21D exerts less influence on the characteristic of the FET 11 than capacitance generated between the gates 22A-22F and the sources 21A-21D does.

The semiconductor device 1 further includes the gate bus bar 52 that electrically connects each of the gates 22A-22F, and the drain bus bar 62 that electrically connects each of the drains 23A-23C, and arranges the gate bus bar 52 and drain bus bar 62 inside the opening 25a of the ground pattern 25. That is, the gate bus bar 52 and the drain bus bar 62 do not overlap with the ground pattern. Such arrangement improves the characteristic as a transmission line of the gate bus bar 52 and the drain bus bar 62.

Figure 6:
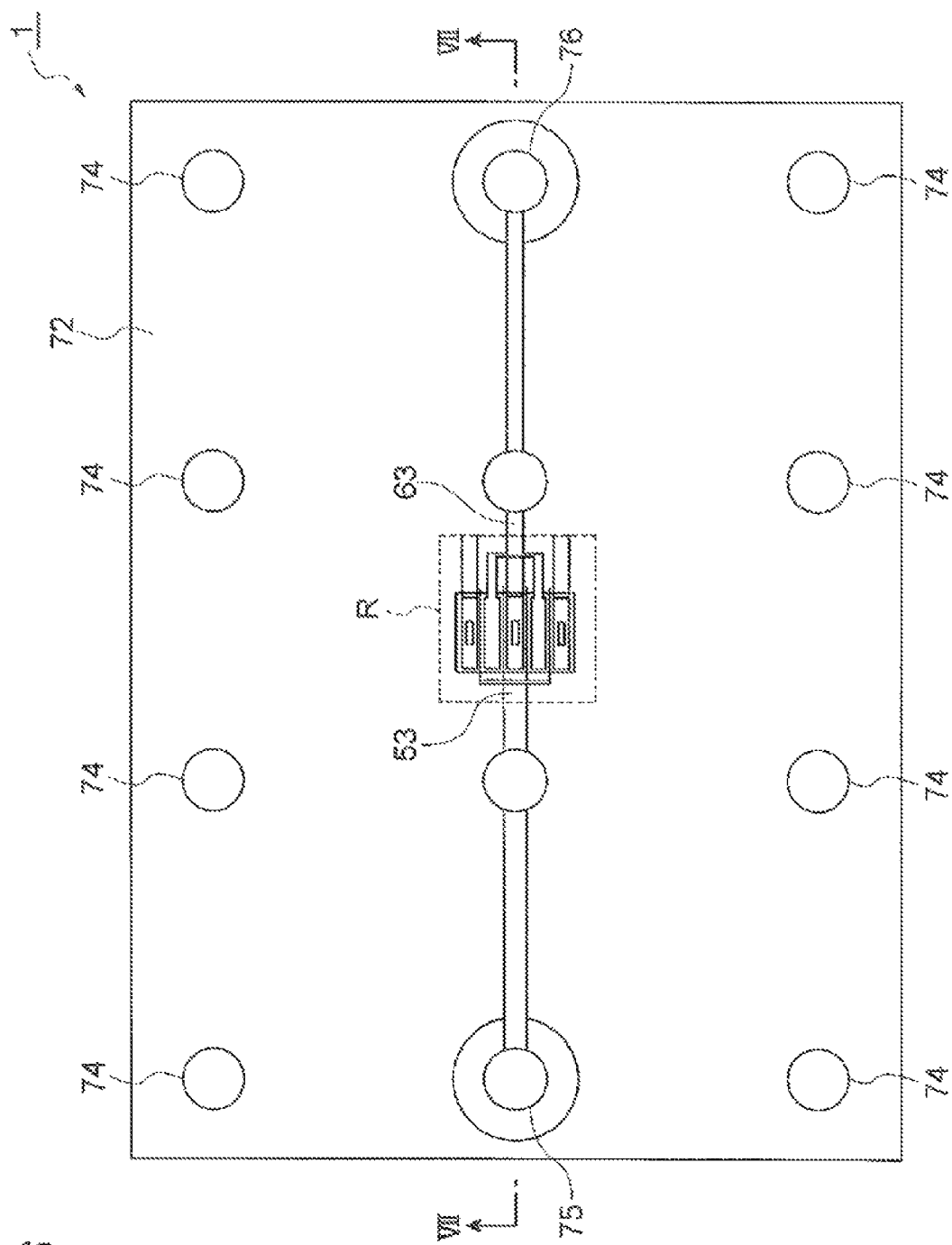
FIG. 6 is a diagram illustrating one example of arrangement of a ground pattern.

It is assumed that the ground pattern 25 arranged around the FET 11 is directly connected to the reference potential in the semiconductor device 1 illustrated in FIG. 1-FIG. 5, however, the pattern 25 may not always be directly connected to the reference potential. A plan view according to another example of the semiconductor device 1 is illustrated in FIG. 6. The inside of a rectangle R indicated by a broken line in FIG. 6 corresponds to a range illustrated in FIG. 1.

Figure 7:
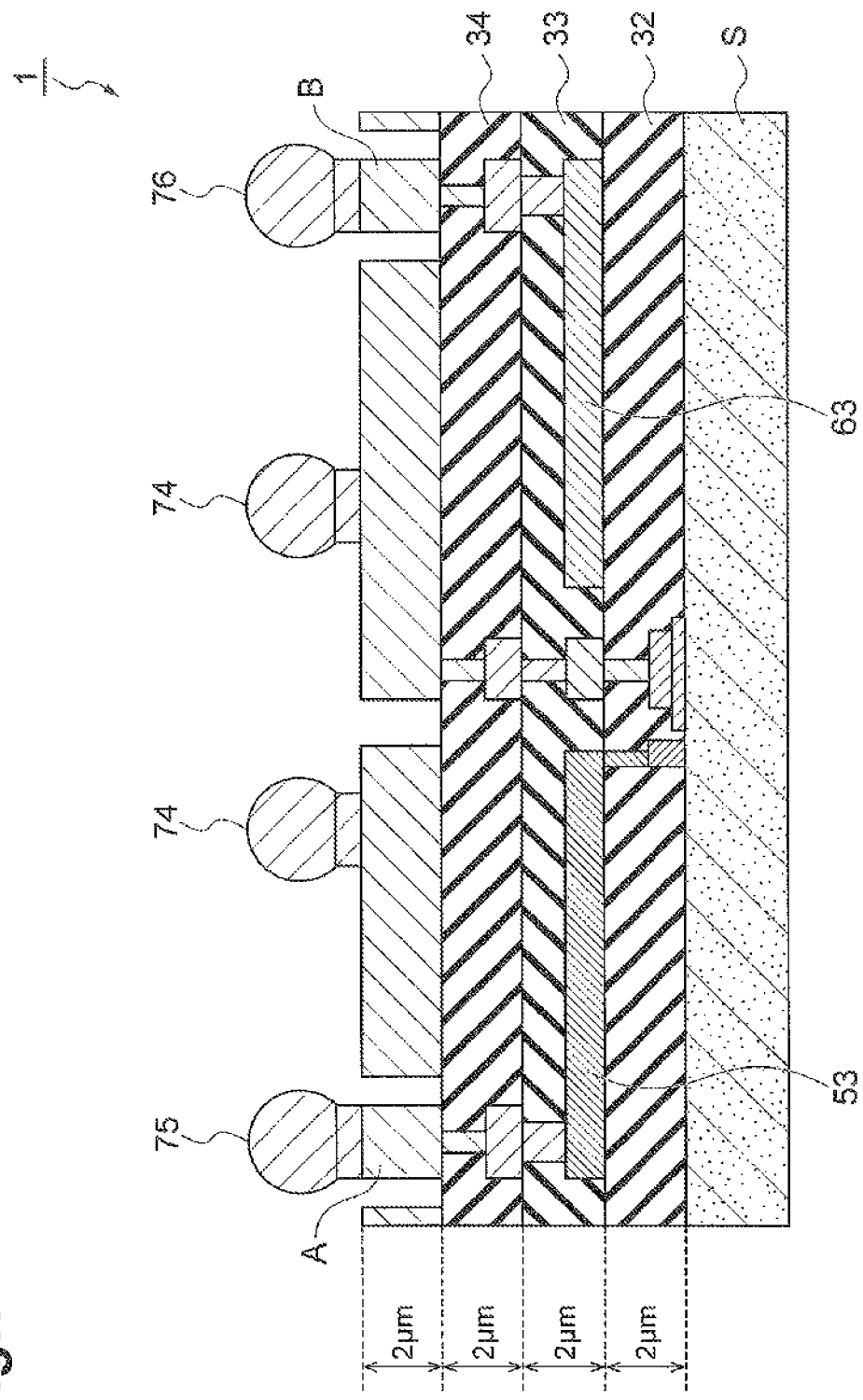
FIG. 7 is a cross-sectional view taken along a line VII-VII in FIG. 6.

The semiconductor device 1 illustrated in FIG. 6 and FIG. 7 includes a plurality of solder balls 74 on a source pattern 72. A shape of an outer periphery of the source pattern 72 is roughly rectangular. On both sides of the source pattern 72, an input terminal A and an output terminal B are provided. The input terminal A is connected with the gate interconnection 53. The output terminal B is connected with the drain interconnection 63. On the input terminal A and the output terminal B, solder balls 75 and 76 are provided. The source pattern 72 is connected to the reference potential through the solder balls 74.

Modification examples of the semiconductor device 1 will be described with reference to FIG. 8 and FIG. 9. A semiconductor device 2 illustrated in FIG. 8 includes a FET 12 instead of the FET 11 in the semiconductor device 1 illustrated in FIG. 1. The FET 12 has four fingers. That is, the FET 12 includes three sources 21A-21C, four gates 22A-22D, and two drains 23A-23B.

The source extractions 24 connected to the source 21A and the source 21C extend in parallel with the disposing direction of the electrodes. On the other hand, the source extraction 24 connected to the source 21B extends in parallel with the longitudinal direction of the electrodes. In this way, the plurality of source extractions 24 may extend in different directions respectively. In the semiconductor device 2, lengths of the individual source extractions 24 from the respective via structures 41 to the ground pattern 25 are $L_{s1}$ and are equal.

Figure 8:
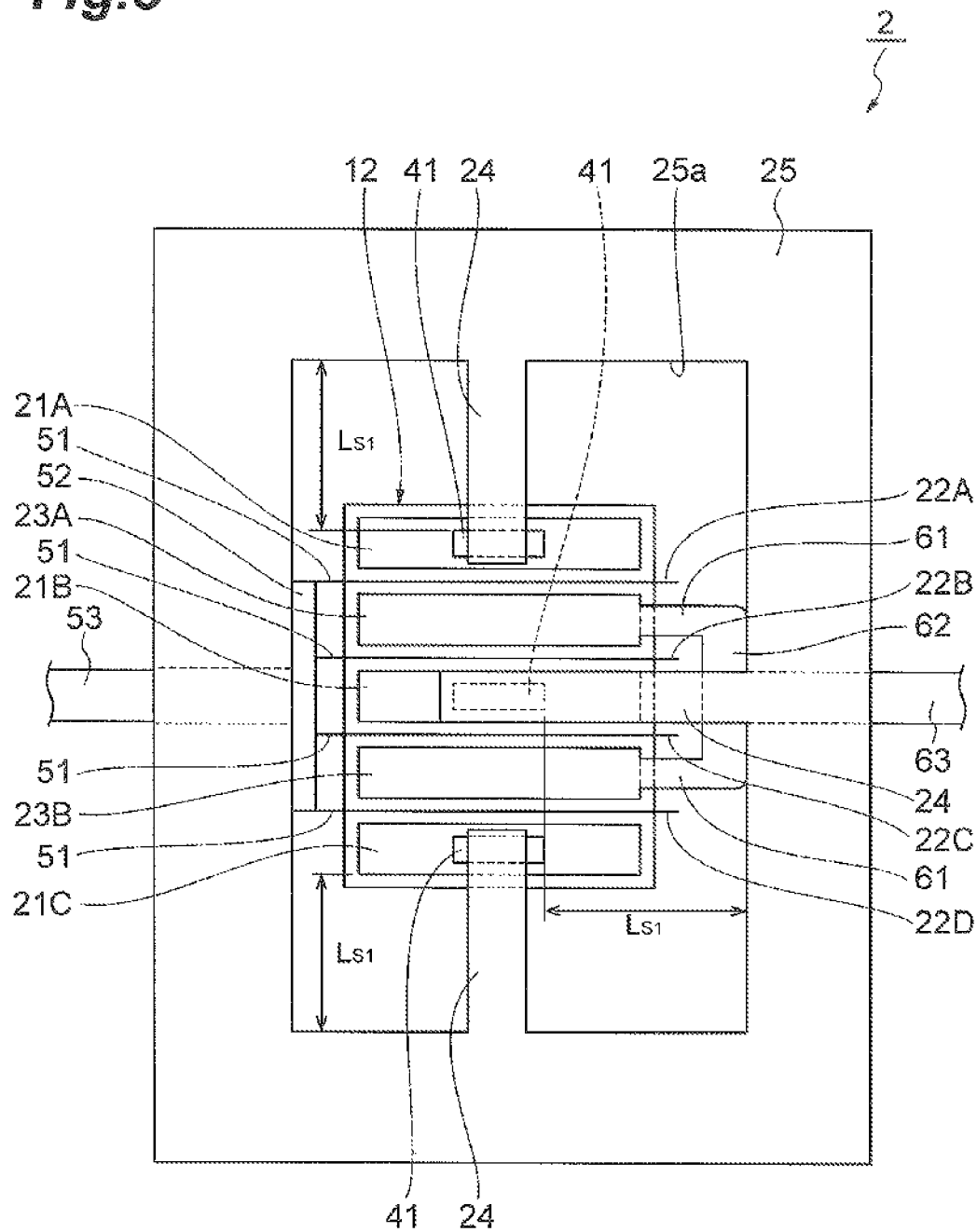
FIG. 8 is a plan view of a semiconductor device according to a modification of one embodiment.
Figure 9:
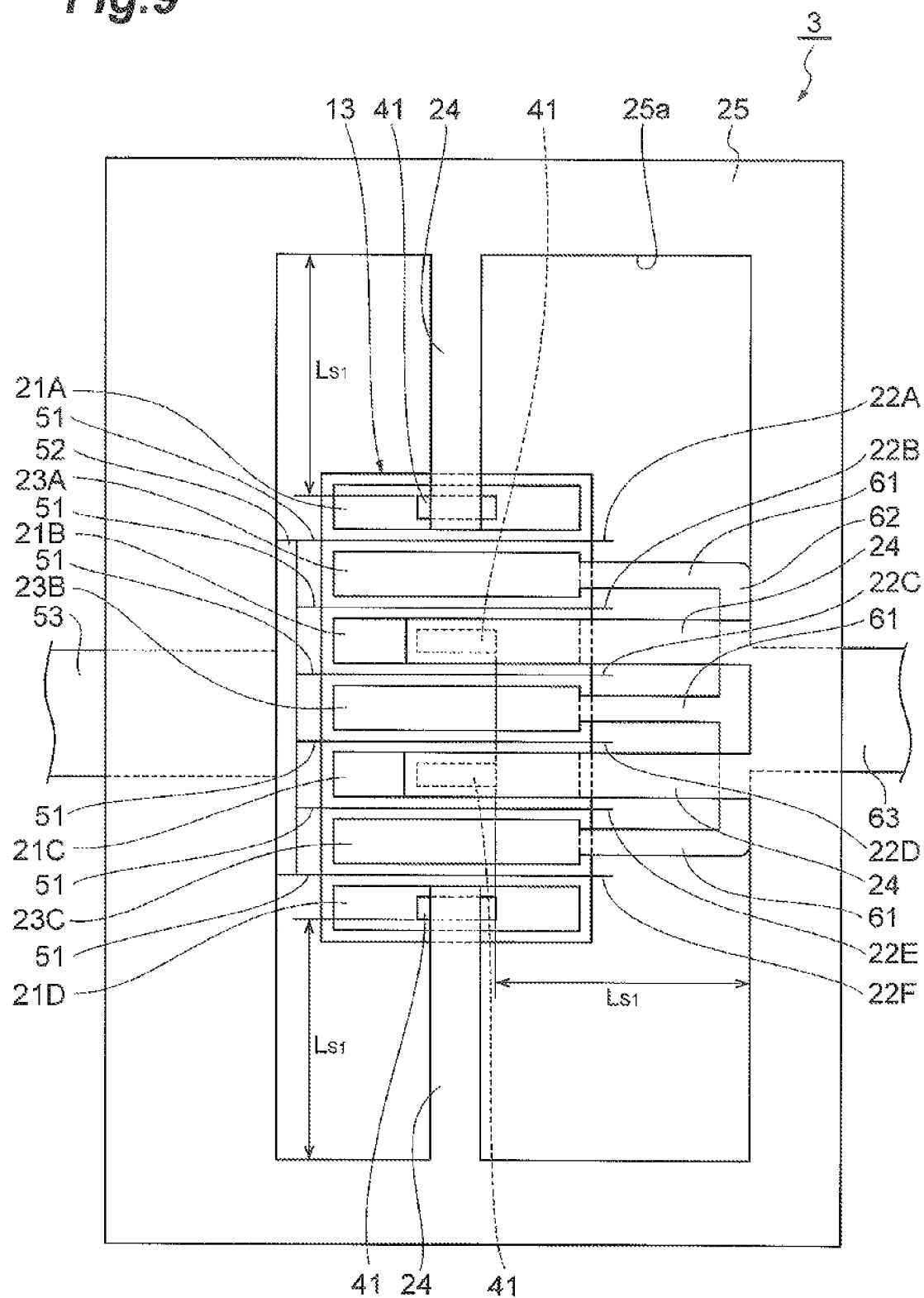
FIG. 9 is a plan view of a semiconductor device according to another modification of one embodiment.

A semiconductor device 3 illustrated in FIG. 9 includes a FET 13 having six fingers, instead of the FET 12 illustrated in FIG. 8. That is, the FET 13 includes four sources 21A-21D, six gates 22A-22F, and three drains 23A-23C.

The source extractions 24 connected to the source 21A and the source 21D extend in parallel with the disposing direction of the electrodes. On the other hand, the source extractions 24 connected to the source 21B and the source 21C extend in parallel with the longitudinal direction of the electrodes. In this way, the plurality of source extractions 24 may extend in different directions respectively. In the semiconductor device 3, the individual source extractions 24 have the equal lengths. That is, distances from the via structure 41 connected to the source extraction 24 to the ground pattern 25 are $L_{s1}$ and are equal in all the source extractions 24.

The present invention is not limited to the above-described embodiment. While the ground pattern 25 is one example of an upper electrode, a potential other than a ground potential may be connected as needed. All the lengths of the individual source extractions 24 may not be made equal, for example. That is, the length of the individual source extraction 24 may be appropriately adjusted according to an electric characteristic or the like requested to the semiconductor device 1. The drain bus bar 62 may be arranged in a layer other than the second wiring layer. In the case of arranging the drain bus bar 62 in a layer other than the second wiring layer, instead of the via metal 47, a via structure including pads and via metals like the via structure 41 is arranged. Further, in the case that a plurality of FETs are loaded on the same semiconductor chip and are connected respectively on the semiconductor chip directly or through a passive element, the present invention may be applied to all the FETs, or the present invention may be applied to only some FETs as needed.

Also, for example, in the case that the number of the gate is one or the like, the gate bus bar 52 may be removed. In the case that the number of the drain is one or the like, the drain bus bar 62 may be removed.

What is claimed is:

1. A semiconductor device, comprising:
    a field effect transistor (FET) provided in a substrate, the FET including a plurality of gates, sources, and drains each extending in parallel along a longitudinal direction of the gates, the sources, and the drains;
    an upper electrode provided above the substrate with an insulating layer therebetween, the upper electrode having an opening where the FET is disposed; and
    a plurality of source extractions each connected to respective sources through via structures passing the insulating layer and to the upper electrode, the source extractions extending along the longitudinal direction.

2. The semiconductor device of claim 1, wherein the substrate has no back electrode connected to the sources through substrate via structures.

3. The semiconductor device of claim 1, wherein the source extractions have a length from respective via structures to the upper electrode same to each other.

4. The semiconductor device of claim 1, further comprising a gate bus bar connecting respective gates and a drain bus bar connecting respective drains,
    wherein the gate bus bar and the drain bus bar are provided within the opening and not overlapped with the upper electrode.

5. The semiconductor device of claim 4, wherein the drain bus bar and the gate bus bar extend in a direction perpendicular to the longitudinal direction.

6. The semiconductor device of claim 4, further comprising a plurality of drain extractions each connecting the drains to the drain bus bar,
    wherein the drain extractions extend along the longitudinal direction.

7. The semiconductor device of claim 4, wherein the drain bus bar and the gate bus bar put the gates, the sources, and the drains therebetween, the drain bus bar being put in a side where the source extractions are pulled out toward the upper electrode.

8. The semiconductor device of claim 1, wherein the via structures are provided directly on the respective sources.

9. The semiconductor device of claim 1, wherein each of the via structures including a pad, a via metal connecting the source to the pad, and another via metal connecting the pad to the source extraction.

10. The semiconductor device of claim 1, wherein the upper electrode is connected with a reference electric potential terminal through a ball.

11. A semiconductor device, comprising:
    a field effect transistor (FET) provided in a substrate, the FET including at least two gates, two sources, and a drain each extending in parallel along a longitudinal direction of the two gates, the two sources, and the drain, one of the gates being put between one of the sources and the drain, another of the gates being put between another of the sources and the drain;
    an upper electrode provided above the substrate with an insulating layer therebetween, the upper electrode having an opening where the FET is disposed; and
    at least two source extractions each connected to respective sources through via structures passing the insulating layer and to the upper electrode, one of the source extractions extending along the longitudinal direction and another of the source extractions extending along a direction perpendicular to the longitudinal direction,
    wherein the at least two source extractions have respective length from the via structures to the upper electrode same with the other.

12. The semiconductor device of claim 11, wherein the substrate has no back electrode connected to the at least two sources through substrate via structures.

13. The semiconductor device of claim 11, further comprising a gate bus bar connecting the at least two gates, and the gate bus bar being provided within the opening and not overlapped with the upper electrode.

14. The semiconductor device of claim 13, wherein the gate bus bar extends in the direction perpendicular to the longitudinal direction.

15. The semiconductor device of claim 11, wherein the via structures are provided directly on the respective at least two sources.

16. The semiconductor device of claim 15, wherein each of the via structures including a pad, a via metal connecting the source to the pad, and another via metal connecting the pad to the source extraction.

17. The semiconductor device of claim 11, wherein the upper electrode is connected with a reference electric potential terminal through a ball.

* * * * *